(12) United States Patent
Hanada et al.

(10) Patent No.: US 11,003,003 B2
(45) Date of Patent: May 11, 2021

(54) DISPLAY DEVICE

(71) Applicant: Japan Display Inc., Minato-ku (JP)

(72) Inventors: Akihiro Hanada, Minato-ku (JP); Isao Suzumura, Minato-ku (JP); Hajime Watakabe, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/918,453

(22) Filed: Jul. 1, 2020

(65) Prior Publication Data

US 2020/0333652 A1 Oct. 22, 2020

Related U.S. Application Data

(62) Division of application No. 16/153,861, filed on Oct. 8, 2018, now Pat. No. 10,761,354.

(30) Foreign Application Priority Data

Oct. 26, 2017 (JP) .............................. JP2017-207020

(51) Int. Cl.
| | | |
|---|---|---|
| *G02F 1/1333* | (2006.01) | |
| *G02F 1/1368* | (2006.01) | |
| *G02F 1/1335* | (2006.01) | |
| *G02F 1/1362* | (2006.01) | |
| *H01L 27/12* | (2006.01) | |
| *G09F 9/30* | (2006.01) | |

(Continued)

(52) U.S. Cl.
CPC ...... *G02F 1/133305* (2013.01); *G02F 1/1339* (2013.01); *G02F 1/1368* (2013.01); *G02F 1/133512* (2013.01); *G02F 1/133514* (2013.01); *G02F 1/136286* (2013.01); *G09F 9/301* (2013.01); *H01L 27/1214* (2013.01); *H01L 27/1218* (2013.01); *H01L 27/1244* (2013.01); *H01L 27/3276* (2013.01); *H01L 51/0097* (2013.01); *H05K 1/189* (2013.01); *H01L 2251/5338* (2013.01); *H05K 2201/05* (2013.01)

(58) Field of Classification Search
CPC ................................................ G02F 1/133305
See application file for complete search history.

(56) References Cited

U.S. PATENT DOCUMENTS

| | | | |
|---|---|---|---|
| 2011/0007042 A1* | 1/2011 | Miyaguchi | ........ G02F 1/133305 345/204 |
| 2014/0254111 A1 | 9/2014 | Yamazaki et al. | |

(Continued)

FOREIGN PATENT DOCUMENTS

JP 2014-197181 10/2014

*Primary Examiner* — Edmond C Lau
(74) *Attorney, Agent, or Firm* — Oblon, McClelland, Maier & Neustadt, L.L.P.

(57) ABSTRACT

The purpose of the invention is to realize the flexible display device of high reliability; specifically in a structure that a bending area is in a terminal area, and in that disconnection of the wiring does not occur in the bending area. The concrete structure is that: a display device having a display area, a driving circuit area and a bending area comprising: a first thin film transistor and a first interlayer insulating film are formed in the display area, a second thin film transistor and a second interlayer insulating film are formed in the driving circuit area, terminal wirings to connects the display area and the driving circuit area are formed in the bending area.

20 Claims, 24 Drawing Sheets

(51) Int. Cl.
*H05K 1/18* (2006.01)
*G02F 1/1339* (2006.01)
*H01L 27/32* (2006.01)
*H01L 51/00* (2006.01)

(56) References Cited

U.S. PATENT DOCUMENTS

2018/0173277 A1* 6/2018 Lee .................. G06F 1/1652
2020/0027958 A1 1/2020 Suzuki

* cited by examiner

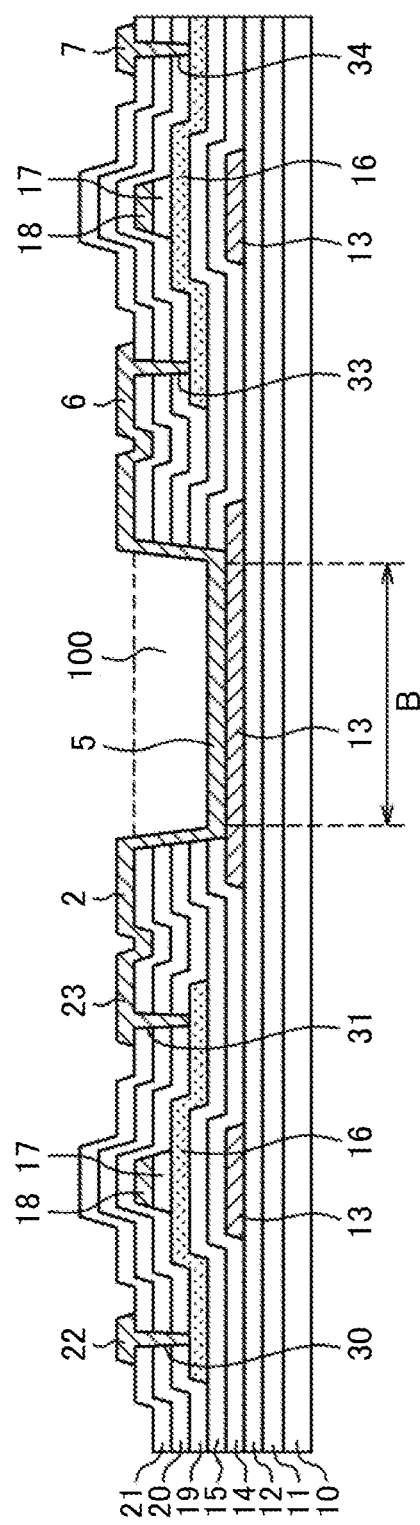

DISPLAY DEVICE

CLAIM OF PRIORITY

The present application is a Divisional of U.S. application Ser. No. 16/153,861 filed Oct. 8, 2018, and claims priority from Japanese Patent Application JP 2017-207020 filed on Oct. 26, 2017, the content of each of which is hereby incorporated by reference into this application.

BACKGROUND OF THE INVENTION

(1) Field of the Invention

The present invention relates to a display device specifically a flexible display device that a terminal area, which is outside of a display area, is bendable.

(2) Description of the Related Art

The liquid crystal display device and the organic EL display device can be bendable by making the substrate thin. In this case, the substrate, on which display elements are formed, is formed by thin glass or thin resin. When the substrate is made of resin like polyimide, more flexible display devices can be realized.

The patent document 1 (Japanese patent application laid open No. 2014-197181) discloses bendable display devices, wherein the wirings are made thinner, or made thicker or bifurcated to prevent a breaking of the wirings at the bending portion.

SUMMARY OF THE INVENTION

The shapes of the display devices have been required to be diversified. A bendable display device can be realized by forming the TFT (Thin Film Transistor) and etc. on the flexible substrate made of e.g. polyimide. The displays are comprised of many wiring layers and many insulating layers. The insulating layers are relatively hard; thus if they are bent in relatively small radius of curvature, they are broken. At the same time, the wirings that are formed on the insulating layer are also broken; consequently, the disconnections in the wirings occur.

The purpose of the present invention is to avoid disconnection of the wirings due to breaking of the insulating layer at the bending portion in the bendable display device; thus, to realize a flexible display device of high reliability.

The present invention overcomes the above explained problem; the concrete structures are as follows.

(1) A display device having a display area, a driving circuit area and a bending area comprising:
a first thin film transistor and a first interlayer insulating film are formed in the display area,
a second thin film transistor and a second interlayer insulating film are formed in the driving circuit area,
the first thin film transistor, the second thin film transistor, the first interlayer insulating film and the second interlayer insulating film are removed in the bending area.

(2) A display device having a display area, a driving circuit area and a bending area comprising:
a first thin film transistor and a first interlayer insulating film are formed in the display area,
a second thin film transistor and a second interlayer insulating film are formed in the driving circuit area,
the first thin film transistor, the second thin film transistor, the first interlayer insulating film and the second interlayer insulating film are removed to form a recess in the bending area,
terminal wirings extend in a first direction and are arranged in a second direction in the recess,
the recess has a corner in a cross sectional view,
a first metal is formed in island shape under the terminal wiring at the corner of the recess,
a width of the first metal in the second direction is bigger than a width of the terminal wiring in the second direction.

BRIEF DESCRIPTION OF THE DRAWINGS

FIG. 15 is a cross sectional view of another example of the embodiment 2;

DETAILED DESCRIPTION OF THE PREFERRED EMBODIMENTS

The present invention will be described in detail referring to the following embodiments.

Embodiment 1

The outer size of the display device can be made small while keeping good visibility of the display screen by keeping the display area flat while making bendable only the terminal area. In addition, a reliability of the display device can be improved by keeping the display area and the peripheral driving circuit area flat, where many Thin Film Transistors (herein after TFT) and so on are formed.

A liberty in assembling of the display device can be improved as a whole by bending the terminal area that is formed on the same substrate as the display area. On the other hand, there is a case that a driving circuit, comprised of TFTs, is formed in the terminal area. There are many TFTs in the driving circuit; thus, this portion is preferably not to be bent. Herein after, the curving and the bending are used having the same meaning. FIGS. 1 through 4 are the examples that the driving circuit is disposed at the area that is not bent.

Figure 1:
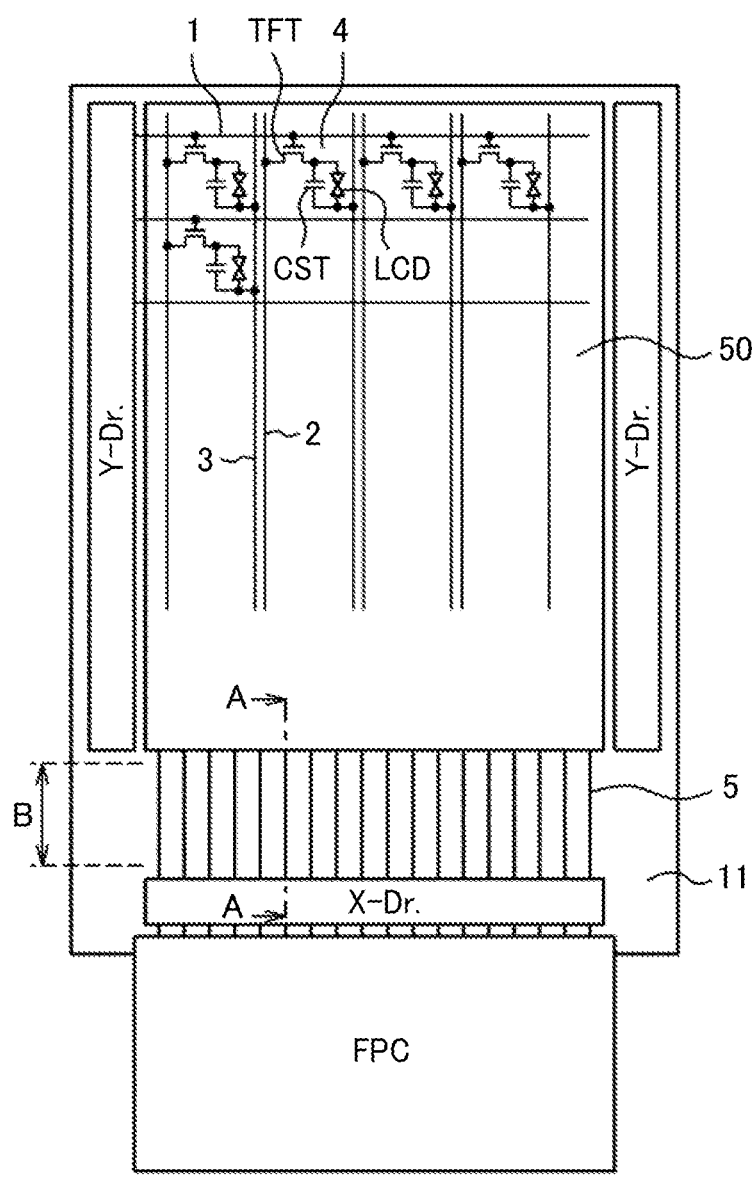
FIG. 1 is a plan view of the liquid crystal display device according to the present invention.

FIG. 1 is a plan view of the flexible display device that the terminal area is to be bent. FIG. 1 is an example of the liquid crystal display device. In the display area 50 in FIG. 1, the scanning lines 1 extend in the lateral direction and are arranged in the longitudinal direction; the video signal lines 2 extend in the longitudinal direction and are arrange in the lateral direction. In FIG. 1, common lines 3 extend in the lateral direction; however, in an actual device, the common electrode that the common voltage is applied is distributed all over the display area in a plane shaped.

In FIG. 1, the area surrounded by the scanning lines 1 and the video signal lines 2 is the pixel 4; the switching TFT is formed in every one of pixels 4. In FIG. 1, the TFT connects with the pixel electrode, the liquid crystal layer LCD exists between the pixel electrode and the common electrode, the storage capacitance CST is formed between the pixel electrode and the common electrode.

The scanning line driving circuits Y-Dr are disposed at the both sides of the display area 50. The video signal line driving circuit X-Dr is disposed in the terminal area; however, in FIG. 1, the video signal line driving circuit X-Dr is disposed apart from the display area 50 to avoid the bending area B. The longitudinal width in FIG. 1 of the bending area B is e.g. 1 mm to 5 mm. The video signal line driving circuit X-Dr and the display area 50 are connected by the terminal wirings 5. The flexible wiring substrate FPC is connected to the edge of the terminal area to supply the power and signals to the liquid crystal display device.

Figure 2:
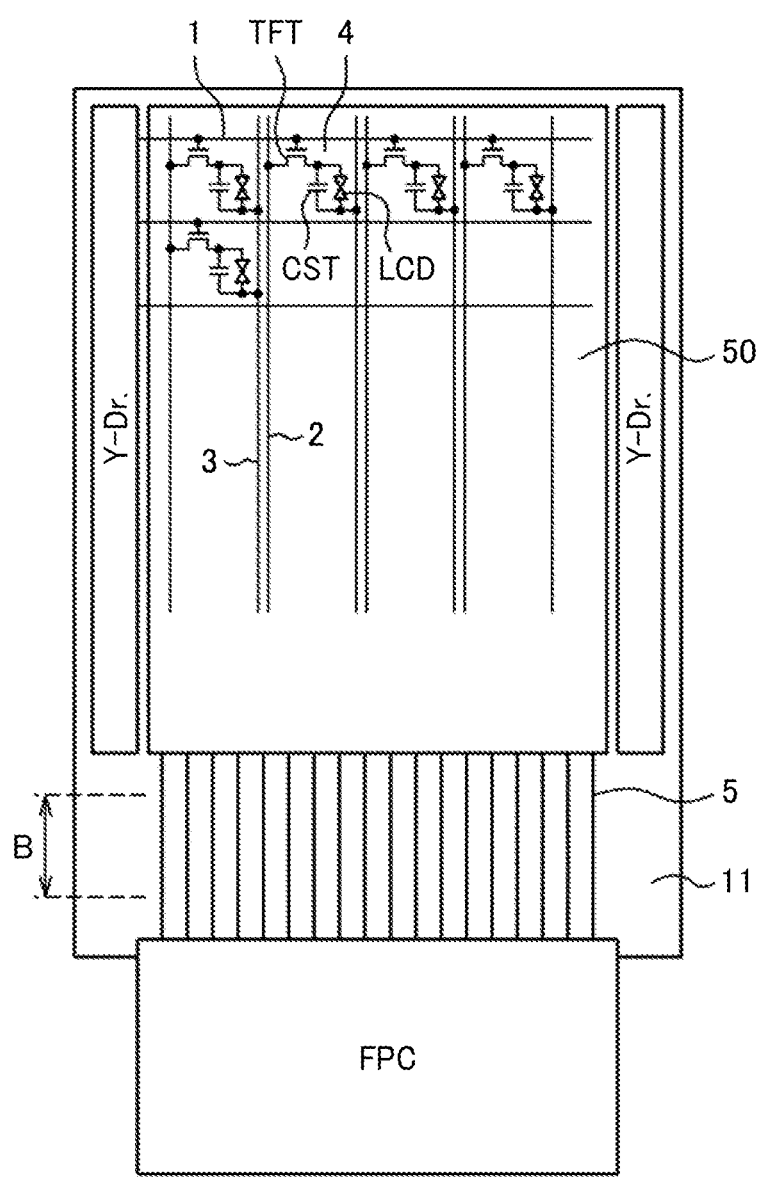
FIG. 2 is a plan view of another example of the liquid crystal display device according to the present invention.
Figure 3:
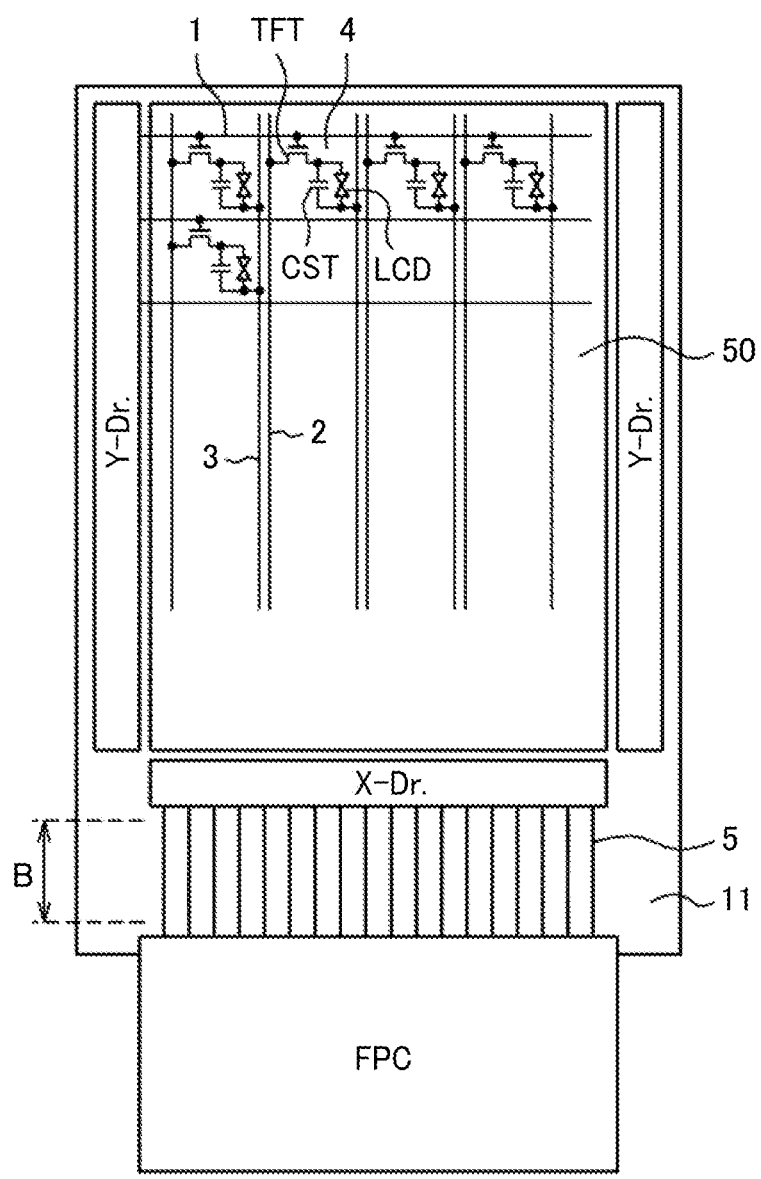
FIG. 3 is a plan view of yet another example of the liquid crystal display device according to the present invention.
Figure 4:
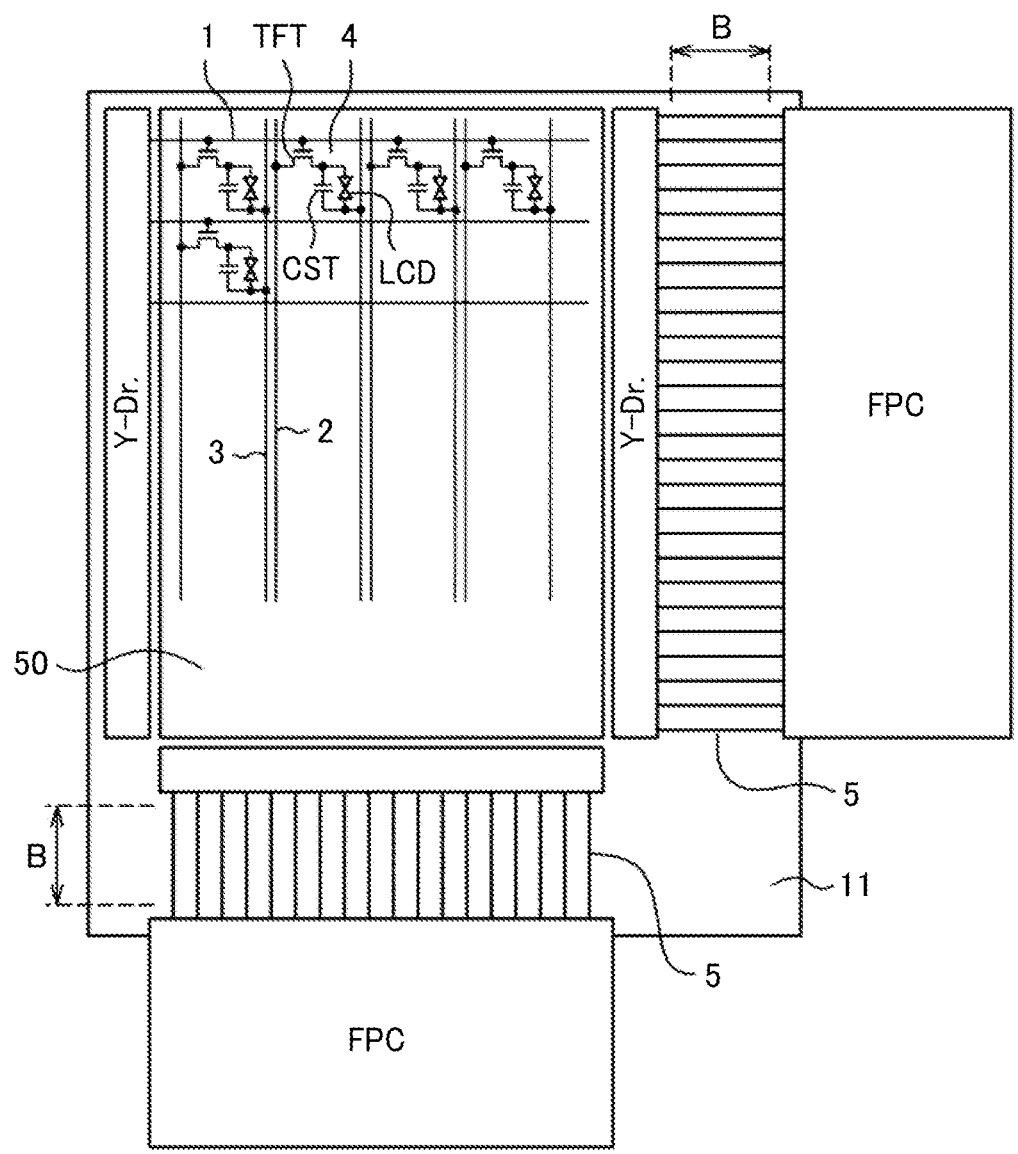
FIG. 4 is a plan view of further yet another example of the liquid crystal display device according to the present invention.

FIG. 2 is the same structure as FIG. 1 except that the video signal line driving circuit X-Dr is installed on the flexible wiring substrate FPC. FIG. 3 is an example that the video signal line driving circuit X-Dr is disposed adjacent to the display area 50 and the bending area B is formed between the video signal line driving circuit X-Dr and the flexible wiring substrate FPC. FIG. 4 is an example that the terminal areas are formed at the two sides of the display area 50. In FIG. 4, the bending areas B are formed to avoid the areas that the scanning line driving circuit Y-Dr and the video signal line driving circuit X-Dr are disposed in the terminal areas.

Figure 5:
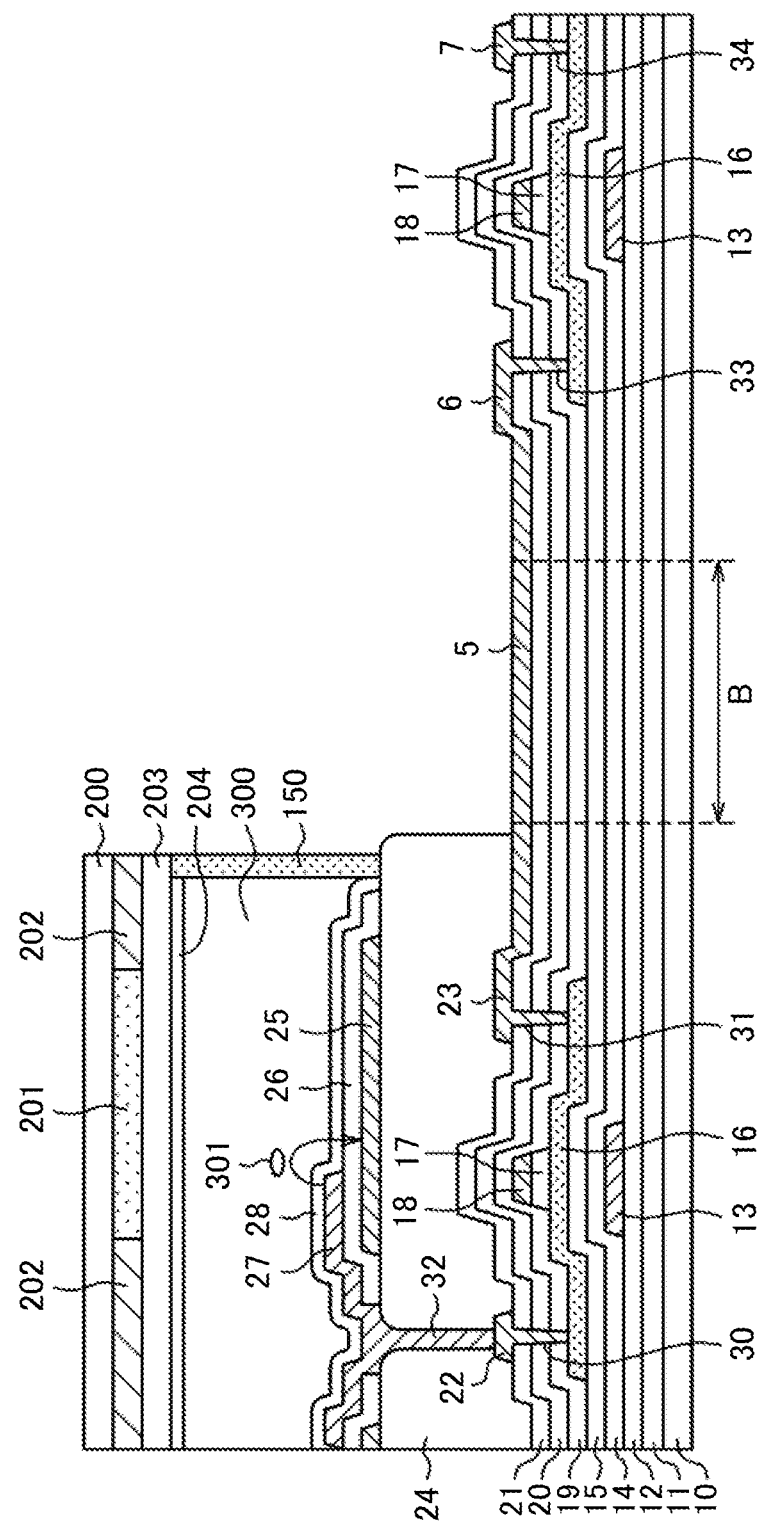
FIG. 5 is cross sectional view along the line A-A in FIG. 1 as a comparative example of the liquid crystal display device.

Herein after, the present invention is explained in regard to the example of FIG. 1; however, the present invention is applicable to the structure of FIGS. 2 through 4 or other flexible display devices. FIG. 5 is cross sectional view of the liquid crystal display device corresponding to FIG. 1 along the line A-A. In FIG. 5, left hand side is the display area; the right hand side is the driving circuit. The area B between the display area and the driving circuit is the area to be bent. The liquid crystal display device explained below is for the In Plane Switching (IPS) type liquid crystal display device; however, the present invention is applicable to other types of liquid crystal display devices.

In the display area of FIG. 5, the TFTs having the oxide semiconductors 16 are formed in the display area. The leak current can be made small in the TFT of the oxide semiconductor layer 16. By the way, among the oxide semiconductors 16, the oxide semiconductors that are optically transparent and amorphous are called TAOS (Transparent Amorphous Oxide Semiconductor). The examples of TAOS are IGZO (Indium Gallium Zinc Oxide), ITZO (Indium Tin Zinc Oxide), ZnON (Zinc Oxide Nitride), IGO (Indium Gallium Oxide), and so on. In the present invention, it is explained that IGZO is used for the oxide semiconductor layer 16. The similar TFTs are used in the driving circuits, too.

In FIG. 5, the TFT substrate 11 made of resin is formed on the glass substrate 10. The polyimide is the most favorable among the resins for the TFT substrate 11 considering mechanical strength and heat resistance and so on. The glass substrate 10 is necessary in the manufacturing process; the glass substrate 10 is removed by e.g. laser abrasion from the TFT substrate 11 made of polyimide after the display device is completed. The barrier film 12 is formed on the TFT substrate 11 to prevent the semiconductor layer 16 from being contaminated by impurities from the TFT substrate 11 of polyimide. The barrier film 12 is formed by e.g. a laminated film of the silicon oxide (herein after SiO) film and the silicon nitride (herein after SiN) film.

The light shield metal 13 made of metal is formed on the barrier film 12. The light shield metal 13 has a role to shield the light from the back light to prevent the photo current in the semiconductor layer 16. The first undercoat film 14 made of SiN is formed covering the light shield metal 13; the second undercoat film 15 made of SiO is formed on the first undercoat film 14. The oxide semiconductor layer 16 made of IGZO is formed on the second undercoat film 15.

The gate insulating film 17 made of SiO is formed on the oxide semiconductor layer 16; the gate electrode 18 is formed on the gate insulating film 17. The gate electrode 18 is made either one of MoW, Al, or Ti, etc. After the gate electrode 18 is formed, the drain region and the source region are formed in the semiconductor layer 16 either by: the ion implantation of e.g. Ar using the gate electrode 18 as the mask, or deoxidization by hydrogen using the gate electrode 18 as the mask.

The first interlayer insulating film 19 made of SiO is formed to cover the gate electrode 18; the second interlayer insulating film 20 made of SiN is formed on the first interlayer insulating film 19; the third interlayer insulating film 21 made of SiO is formed on the second interlayer insulating film 20. After that, the through hole 30 is made through the first interlayer insulating film 19 to the third interlayer insulating film 21 to connect the source region and the source electrode 22; and the through hole 31 is made through the first interlayer insulating film 19 to the third interlayer insulating film 21 to connect the drain region and the drain electrode 23

After that, the organic passivation film 24 is formed covering the source electrode 22 and the drain electrode 23. Since the organic passivation film 24 has a role of a flattening film, too, it is made as thick as 2-4 microns. The organic passivation film 24 is patterned to be removed from the terminal area, and at the same time, to form the through hole 32 in the organic passivation film 24 to connect the source electrode 22 and the pixel electrode 27.

After that, the common electrode 25 is formed in a plane shape on the organic passivation film 24; the capacitive insulating film 26 made of SiN is formed on the common electrode 25. The pixel electrode 27 is formed on the capacitive insulating film 26. A plan view of the pixel electrode 27 is stripe shaped or comb shaped. When the area of the pixel is small, the pixel electrode tends to be a stripe shaped; when the area of the pixel is large, the pixel electrode 27 tends to be a comb shaped having a slit inside. The pixel capacitance is formed between the pixel electrode 27 and the common electrode 25 by sandwiching the capacitive insulating film 26. The pixel electrode 27 connects with the source electrode 22 via the through hole 32 formed through the organic passivation film 24 and the capacitive insulating film 26.

The alignment film 28, which is for an initial alignment of the liquid crystal molecules 301, is formed covering the pixel electrode 27. Either rubbing method or photo alignment method that uses polarized ultra violet ray is applied to the alignment treatment of the alignment film 28. The photo alignment method is advantageous in the IPS type liquid crystal display device. The line of force denoted by the arrow in FIG. 5 is generated when a video signal is applied to the pixel electrode 27 to rotate the liquid crystal molecules 301; thus, the transmittance of the liquid crystal layer 300 is controlled.

In FIG. 5, the counter substrate 200 is disposed opposing to the TFT substrate 11 sandwiching the liquid crystal layer 300. The counter substrate 200 and the TFT substrate 11 are adhered to each other by the sealing material 150. The liquid crystal layer 300 is sealed inside from the sealing material 150. Generally, the counter substrate 200 is made of glass; however, in the flexible display device, the counter substrate 200 is made of resin as e.g. polyimide. The color filter 201 and the black matrix 202 are formed on inside surface of the counter substrate 200. The overcoat film 203 is formed covering the color filter 201 and the black matrix 202. The alignment film 204 is formed covering the overcoat film 203. The alignment treatment for the alignment film 204 is the same as explained for the alignment film 28 on the TFT substrate 11.

In FIG. 5, the driving circuit is formed at the right hand side of the bending area B. The driving circuit and the display area 50 are connected by the terminal wirings 5. Many TFTs are formed in the driving circuit, too; however, the structure of the TFT is the same as the TFTs explained in regard to the display area 50.

In the meantime, the source of the TFT formed in the driving circuit connects with the circuit wiring 6 extended from the terminal wiring 5 via the through hole 33. On the other hand, the drain of the TFT formed in the driving circuit connects with the circuit wiring 7 via the through hole 34.

Figure 6:
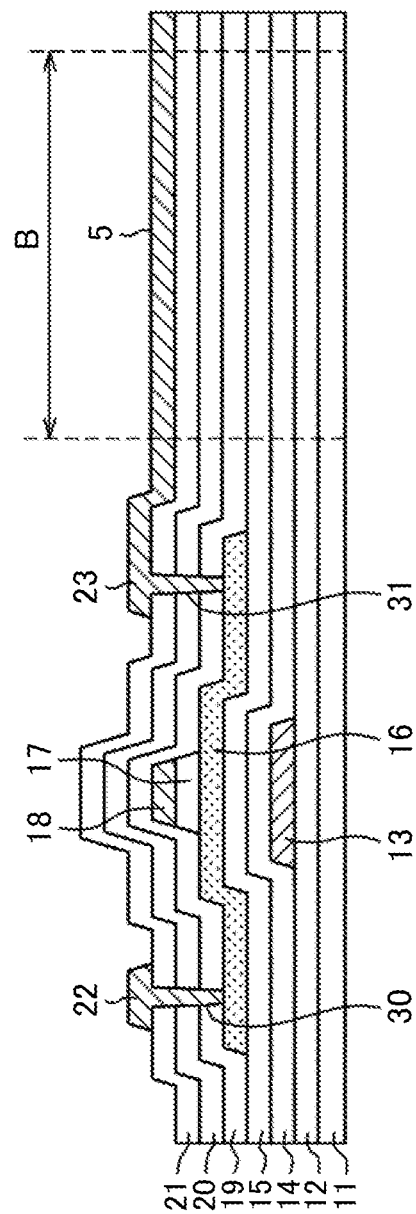
FIG. 6 is a cross sectional view of the TFT substrate side of FIG. 5.

FIG. 6 is a cross sectional view of the region from the display area to the bending area of the TFT substrate side in FIG. 5. In the bending area B in FIG. 6, the terminal wiring 5 that connects the display area and the driving circuit is formed on the insulating layer formed by inorganic insulating films as the SiO film, the SiN film and the like. The inorganic insulating film is harder compared with the metal film, it is easily broken if it is bent. Then, it arises a phenomenon that the disconnection of the wiring occurs simultaneously when the insulating film is broken.

Figure 7:
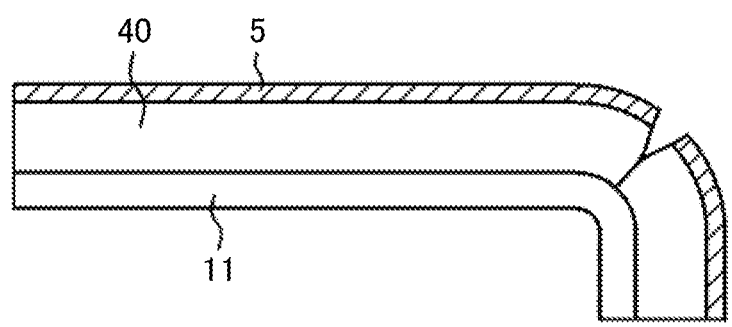
FIG. 7 is a cross sectional view that shows a problem of the structure of FIG. 6.

FIG. 7 is a cross sectional view that shows this phenomenon. FIG. 7 is a cross sectional view that the polyimide substrate 11 is bent; wherein the inorganic insulating film 40 is formed on the polyimide substrate 11; the metal wiring 5 is formed on the inorganic insulating film 40. In FIG. 7, the polyimide substrate 11 can be flexibly bent. The inorganic insulating film 40, however, is hard, thus, it is broken when it is bent. Specifically, when the inorganic insulating film 40 is a multi-layered film, the thickness tends to be big as a whole; consequently, stress becomes big if it is bent; thus, the inorganic insulating film 40 becomes easier to be broken. Even the metal wiring 5 is relatively flexible, when the insulating film 40 underneath is broken, the metal wiring 5 is also broken simultaneously, as depicted in FIG. 7.

Figure 8:
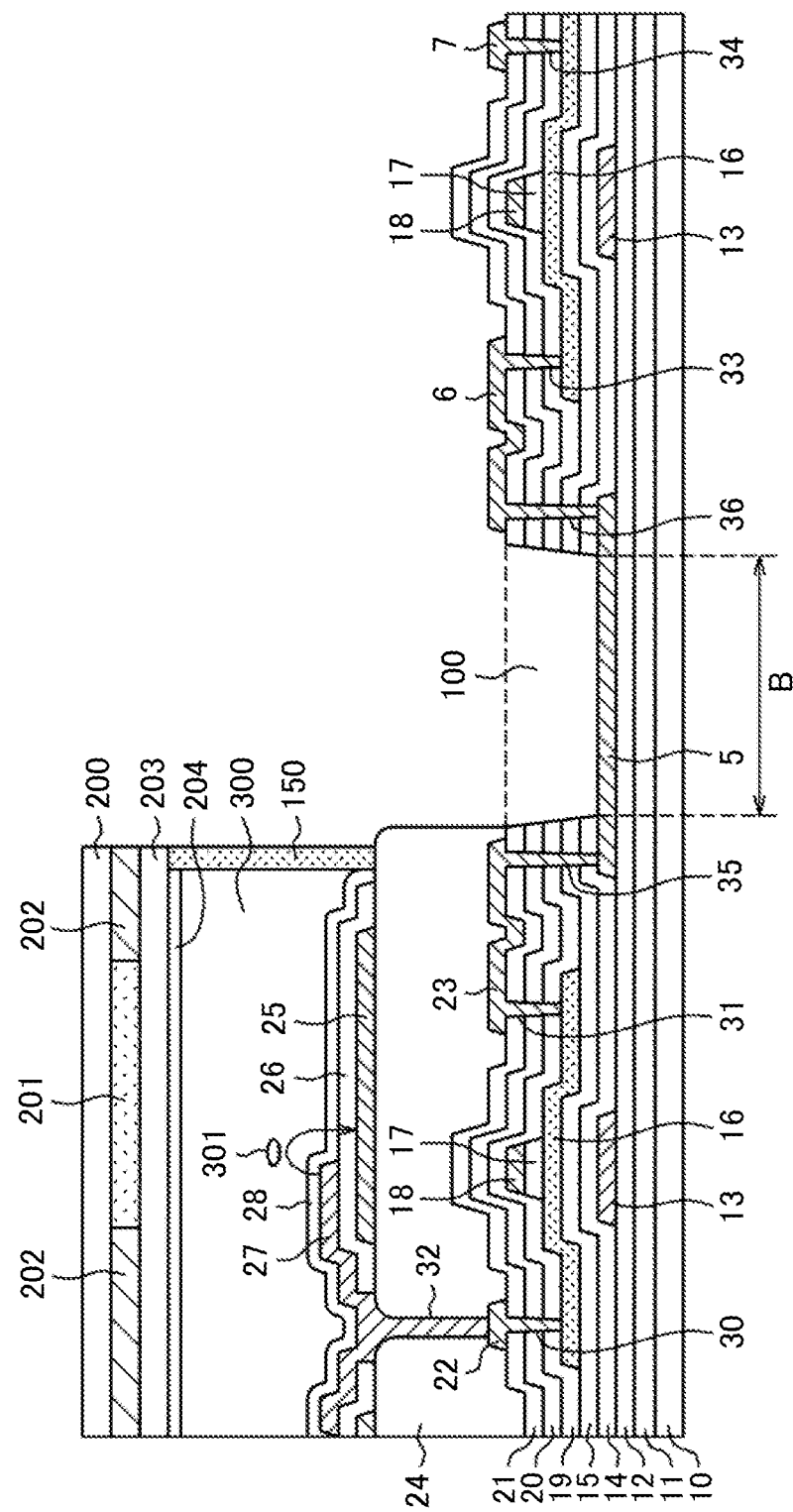
FIG. 8 is cross sectional view along the line A-A in FIG. 1 of the liquid crystal display device according to the present invention.

FIG. 8 is a cross sectional view of the present invention that countermeasures the above explained problem. The structure of FIG. 8 is approximately the same as the structure explained in FIG. 5 except the bending area B. In the bending area B in FIG. 8, five inorganic insulating layers are eliminated; namely, the first undercoat film 14, the second undercoat film 15, the first interlayer insulating film 19, the second interlayer insulating film 20 and the third interlayer insulating film 21 are removed. The display area and the driving circuit area are electrically connected by the terminal wirings 5, which are formed by the same metal that constitutes the light shield metal 13. The metal that constitutes the light shield metal 13 and the terminal wiring 5 is the same metal as the gate electrode as e.g. MoW. If the low electric resistance is required, the terminal wiring 5 is made as the structure that the layer of the aluminum as the major substance is sandwiched by the metal film of Ti or the metal film of Mo and the like.

In the bending area B of FIG. 8, the TFT substrate 11 made of polyimide is formed on the glass substrate 10; the barrier film 12 is formed on the TFT substrate 11; the terminal wiring 5 is formed on the barrier film 12. Among them, the glass substrate 10 is removed in the final structure of the display device. Therefore, the layers to be bent in the bending area B actually consist of the polyimide substrate 11, the barrier film 12 and the terminal wirings 5.

The barrier film 12 is e.g. a two layer structure comprised of the SiO film and the SiN film. In the bending area B, however, five layers of first undercoat film 14 through the third interlayer insulating film 21 are removed, thus, the insulating layer as a whole is made thin. Therefore, the stress in the insulating film becomes less when it is bent, thus, the barrier film 12 is not broken. Consequently, the disconnection of the terminal wiring 5, which is formed on the barrier film 12, does not occur.

In FIG. 8, the drain electrode 23 connects with the video signal line 2; the video signal line 2 connects with the terminal wiring 5 via the through hole 35. In the driving circuit of FIG. 8, the terminal wiring 5 connects with the circuit wiring 6 via the through hole 36. Other structures in FIG. 8 are the same as explained in FIG. 5.

Figure 9:
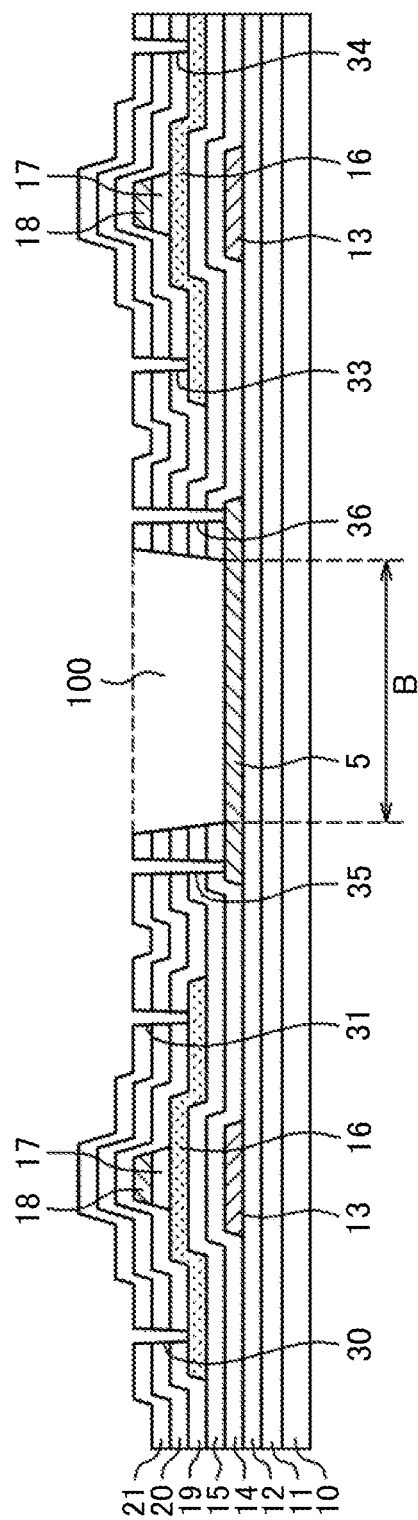
FIG. 9 is a cross sectional view in an interim process to form the structure of FIG. 8.

FIGS. 9 through 12 are cross sectional views of the TFT substrate side in the interim processes to realize the structure of FIG. 8. In FIG. 9, the processes up to forming the barrier film 12 are the same as explained in FIG. 5. In FIG. 9, however, the terminal wiring 5 is formed on the barrier film 12 simultaneously with the light shield metal 13. The terminal wiring 5 is made of the same material as the light shield metal 13 and is made simultaneously as the light shield metal 13.

The subsequent processes up to the third interlayer insulating film 21 are the same as explained in FIG. 5. After that, the through holes are formed; in FIG. 9, however, in addition to through holes formed in FIG. 5, the recess 100 is formed in the bending area B by removing the first undercoat film 14, the second undercoat film 15, the first interlayer insulating film 19, the second interlayer insulating film 20, and the third interlayer insulating film 21. By the way, to avoid patterning defects due to the unevenness, the recess 100 can be made after the pixel electrode 27 is formed.

Further, the through hole 35 is formed in the display area, and the through hole 36 is formed in the driving circuit area in the undercoat films 14, 15 and the interlayer insulating films 19, 20, 21. Thus, the connections of the terminal wirings 5 with other wirings can be made.

Figure 10:
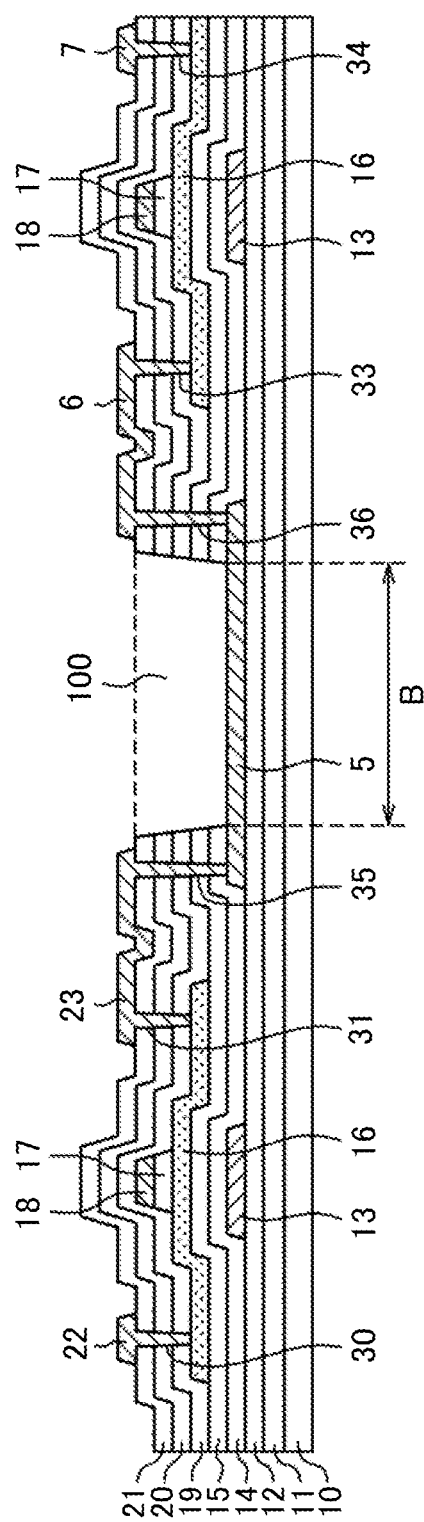
FIG. 10 is a cross sectional view in an interim process following FIG. 9 to form the structure of FIG. 8.

FIG. 10 shows that the source electrode 22 is formed in the through hole 30, the drain electrode 23 is formed in the through hole 31, the video signal line is formed in the through hole 35, the circuit wiring 6 is formed in the through holes 33, 36, and the circuit wiring 7 is formed in the through hole 34. Thus, the wirings in the display area, the wirings in the driving circuit, and the connection between the display area and the driving circuit are made.

Figure 11:
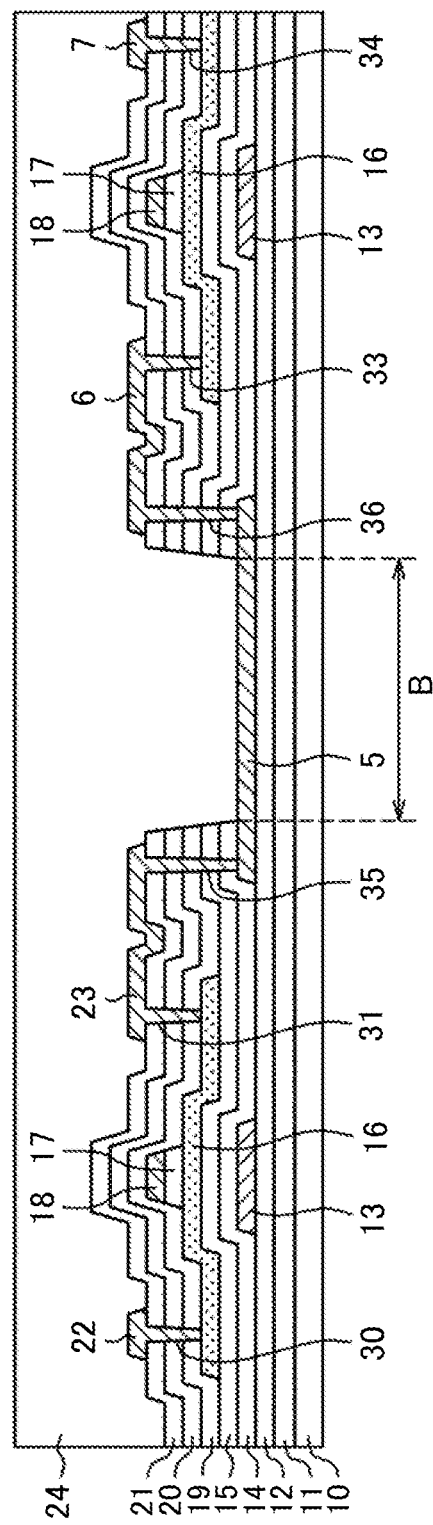
FIG. 11 is a cross sectional view in an interim process following FIG. 10 to form the structure of FIG. 8.

FIG. 11 is a cross sectional view that the organic passivation film 24 is formed covering the display area, the recess 100 and the driving circuit. The organic passivation film 24 is made of photo sensitive resin as acrylic. Since the organic passivation film 24 has a role as a flattening film in the display area, it is formed thick as 2 to 4 microns.

Figure 12:
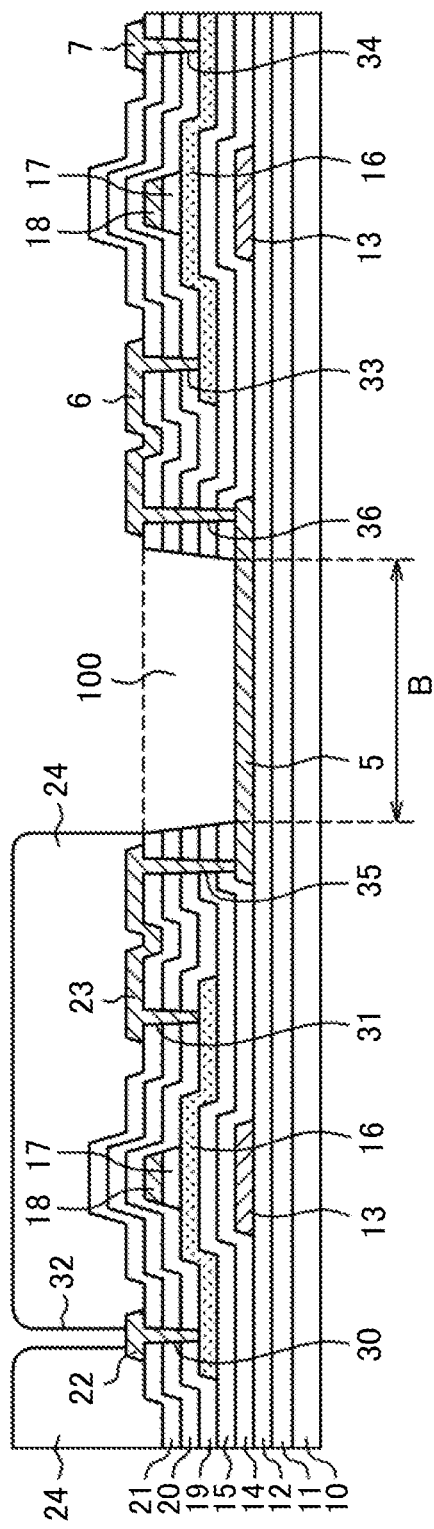
FIG. 12 is a cross sectional view in an interim process following FIG. 11 to form the structure of FIG. 8.

FIG. 12 is a cross sectional view that the organic passivation film 24 is patterned. Since the organic passivation film 24 is made of the photo sensitive resin, it can be patterned without using the photo resist. After that, the organic passivation film 24 is put in calcination.

Figure 13:
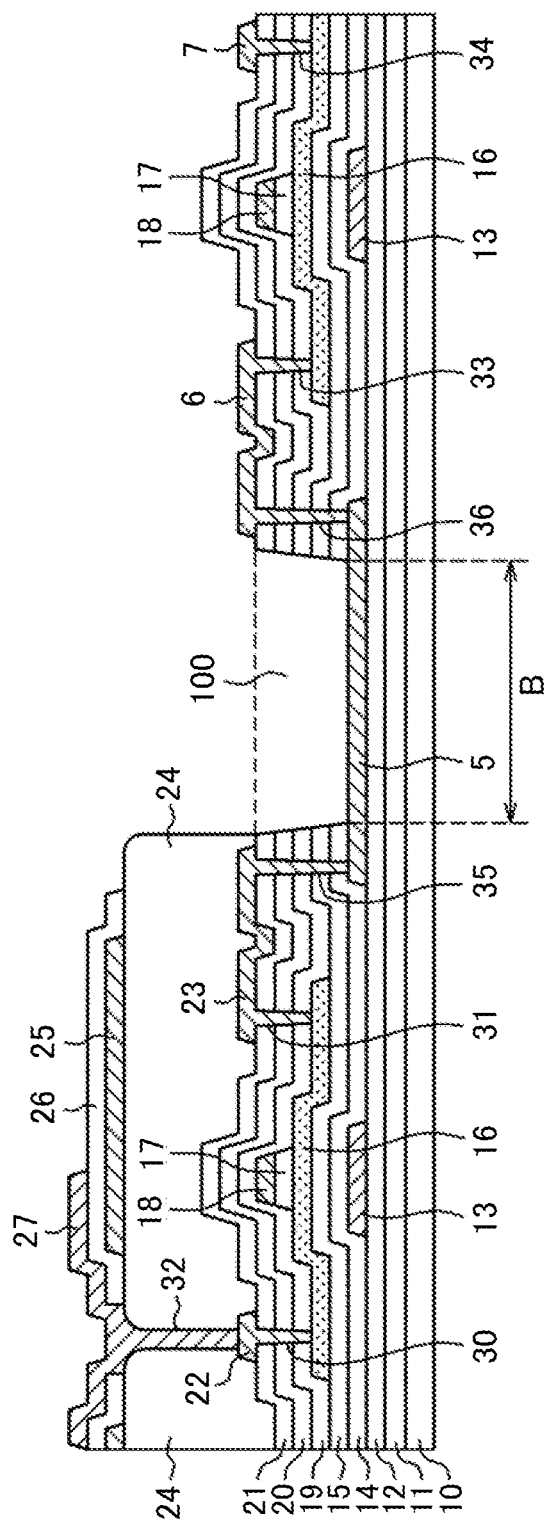
FIG. 13 is a cross sectional view in an interim process following FIG. 12 to form the structure of FIG. 8.

FIG. 13 is a cross sectional view that the common electrode 25, the capacitive insulating film 26 and the pixel electrode 27 are formed on the organic passivation film 24, wherein the pixel electrode 27 and the source electrode 22 are connected via the through hole 32 in the display area. This structure is the same as explained in FIG. 5.

After that, the counter substrate 200 is disposed and the liquid crystal is sealed inside; thus, the structure of FIG. 8 is completed. As described above, the breaking of the inorganic insulating film and a consequent disconnection of the wiring in the bending area B can be avoided by removing the plural layers of the inorganic insulating films from the bending area B; thus, flexible display device of high reliability can be realized.

Embodiment 2

Figure 14:
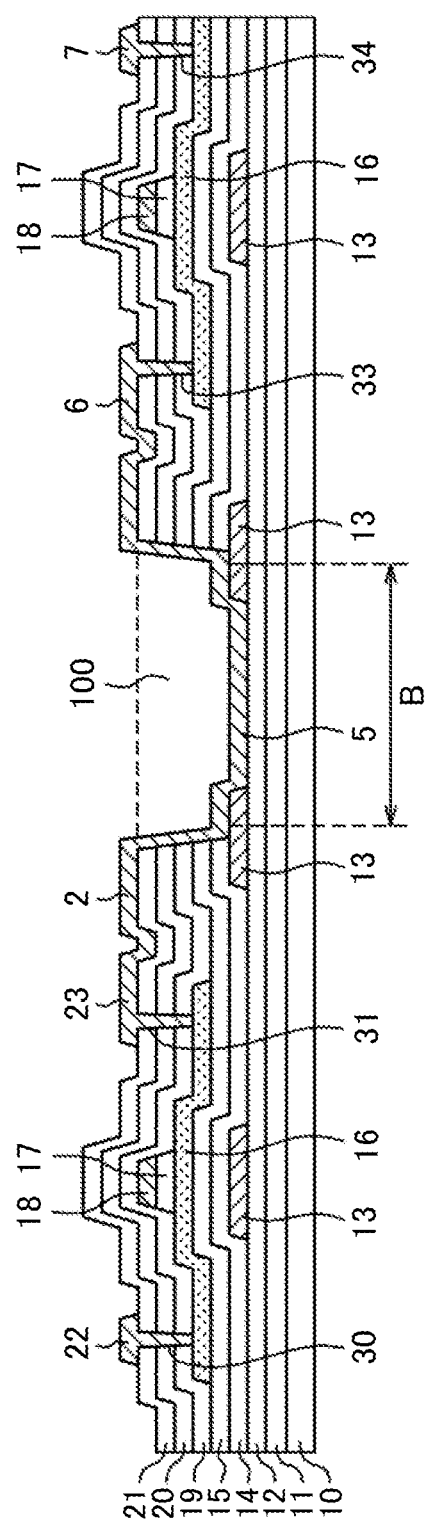
FIG. 14 is a cross sectional view of the embodiment 2.

FIG. 14 is a cross sectional view of the TFT substrate side according to the embodiment 2. FIG. 14 differs from FIG. 10 of the embodiment 1 in that: the terminal wiring 5 that connects the display area and the driving circuit area is formed by the same wiring as the drain electrode 23 or the video signal line 2. In FIG. 10, the drain electrode 23 and the terminal wiring 5, which is formed on the same layer as the light shield metal 13, are connected via the through hole 35; and the circuit wiring 6 and the terminal wiring 5 are connected via the through hole 36. On the contrary, in the structure of FIG. 14, the through holes 35 and 36 can be eliminated, thus, a reliability of connection can be improved.

By the way, the light shield metal 13 is formed at the corner of the recess 100 in FIG. 14. This is to avoid the resist remaining at the corner of the recess 100 as will be explained in the embodiment 3; however, the light shield metal 13 at the corner of the recess 100 is not indispensable.

FIG. 15 is another example of the embodiment 3. FIG. 15 differs from FIG. 14 in that the terminal wiring is formed by two layers of a first layer 13 formed on the same layer as the light shield metal 13 and a second layer 5 that extends from the drain electrode 23 or the video signal line 2. According to this structure, the danger of the disconnection of the terminal wiring 5 can be further diminished.

Embodiment 3

Figure 16A:
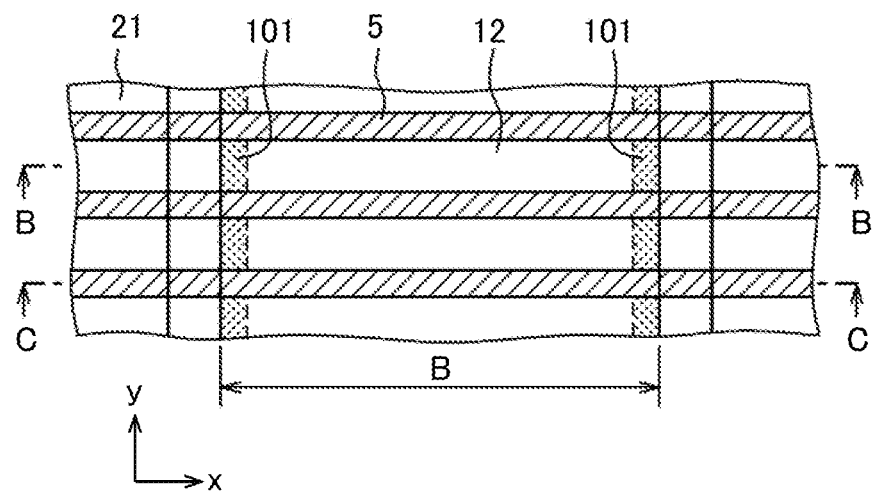
FIG. 16A is a plan view of the embodiment 3.
Figure 16B:
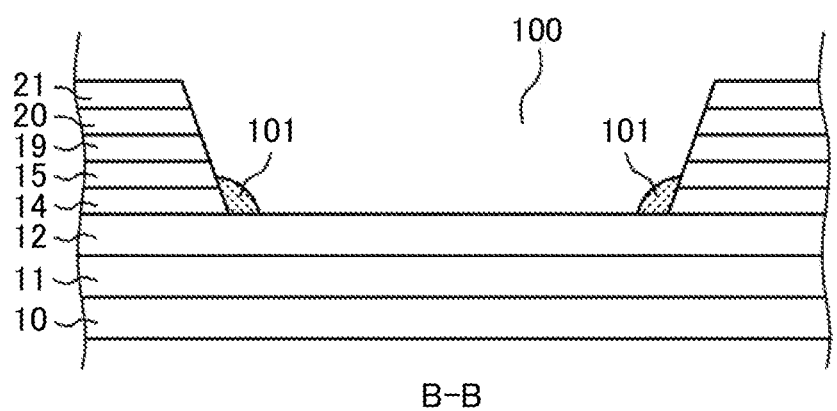
FIG. 16B is a cross sectional view along the B-B line of FIG. 16A.
Figure 16C:
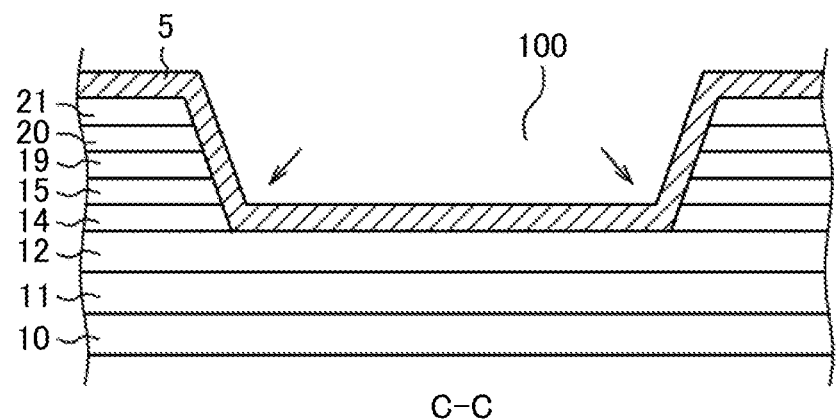
FIG. 16C is a cross sectional view along the C-C line of FIG. 16A.

FIG. 16A through 16C are figures to explain the problem in the recess 100 formed in the bending area B. FIG. 16A is a plan view of the bending area B. In FIG. 16A, the terminal wirings 5 extend in the x direction across the recess 100 formed in the bending area B and are arranged in the y direction in a certain pitch.

FIG. 16B is a cross sectional view along the line B-B in FIG. 16A. As shown in FIG. 16B, the resist remaining 101 exists at the corner of the recess 100. The reason is that: the recess 100 is a deep hole through the five inorganic layers; consequently, the light for the exposure is difficult to reach at the corner of the deep hole, thus, there arises a chance that the resist at the corner of the recess is not thoroughly exposed to the light.

FIG. 16C is a cross sectional view along the line C-C in FIG. 16A. The terminal wiring 5 made of metal exists at this portion. If the metal film exists at the corner of the recess 100, the light is reflected by the metal film during the exposure, the reflected light can compensate the exposing light; thus, the resist remaining tends not to occur.

However, as depicted in FIG. 16A, if the resist remains between the terminal wiring 5 and the terminal wiring 5, there is a chance that the metal or the transparent conductive film as ITO (Indium Tin Oxide) remains. This causes an electrical leak between the terminal wirings 5. Therefore, the chance of the resist remaining 101 should be as less as possible.

Figure 17A:
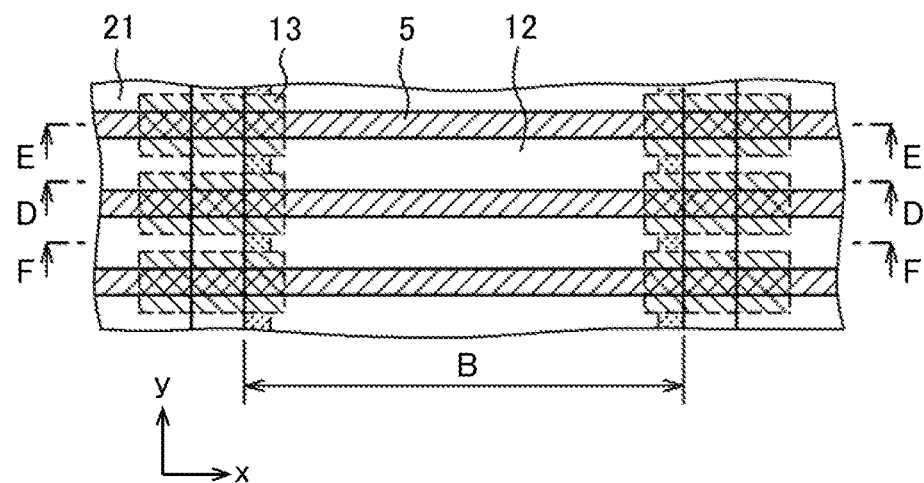
FIG. 17A is a plan view of the embodiment 3.
Figure 17B:
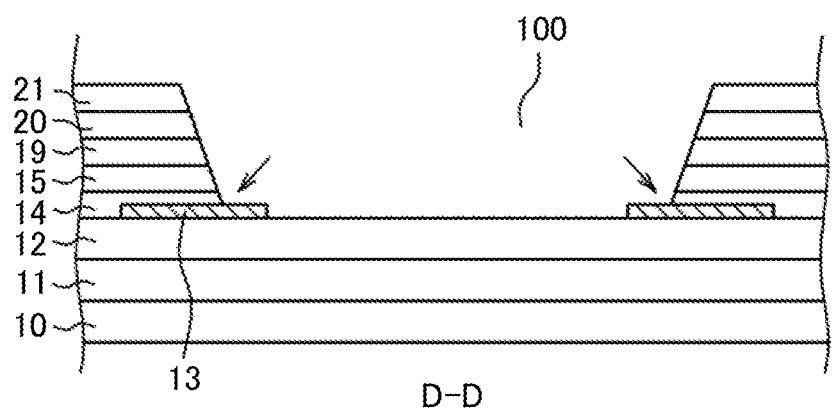
FIG. 17B is a cross sectional view along the D-D line of FIG. 17A.
Figure 17C:
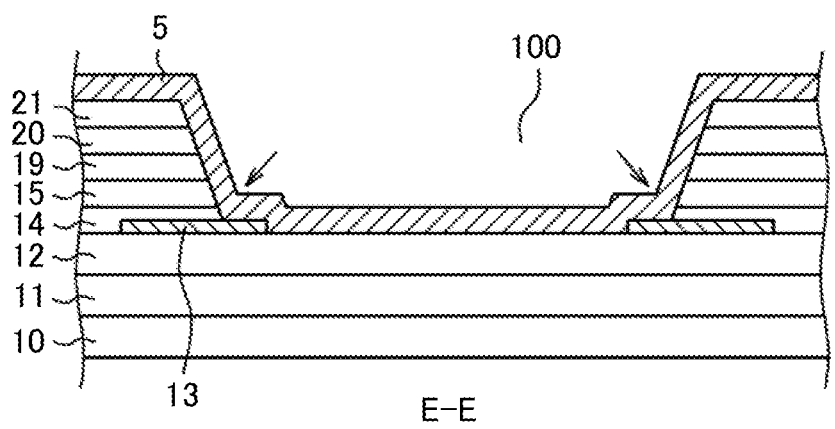
FIG. 17C is a cross sectional view along the E-E line of FIG. 17A.

FIGS. 17A through 17C are the example of the structure to decrease the chance of the resist remaining 101. FIG. 17A is a plan view at the bending area B. In FIG. 17A, the terminal wirings 5 extend in the x direction across the recess 100 and are arranged in the y direction in a certain pitch. In FIG. 17A, the light shield metal 13 is formed in island shape under the terminal wiring at the corner of the recess 100.

FIG. 17B is a cross sectional view along the line D-D in FIG. 17A, namely, a cross sectional view along the line that crosses the light shield metal 13 formed in island shape in the x direction. In FIG. 17B, the light shield metal 13 exists at the corner of the recess 100, as indicated by the arrow; since the light reflected from the light shield metal 13 compensates the exposing light, the resist remaining does not occur.

FIG. 17C is a cross sectional view along the line E-E in FIG. 17A. In FIG. 17C, the light shield metal 13 and the terminal wiring 5 of two layer structure exist at the corner of the recess 100, as indicated by the arrow; since the light reflected from the terminal wiring 5 compensates the exposing light, the resist remaining does not occur.

In a cross sectional view along the line F-F in FIG. 17A, as the same as explained at FIG. 16B, there is a danger that the resist remaining 101 occurs. However, as explained above, since the resist does not exist on the light shield metal 13, the portion of the light shield metal 13 that protrudes from the terminal wiring 5 in y direction in a plan view and that is not protected by the inorganic insulating films 14 to 21 can be eliminated by etching; thus, the electrical leak between the terminal wirings can be avoided.

Figure 18A:
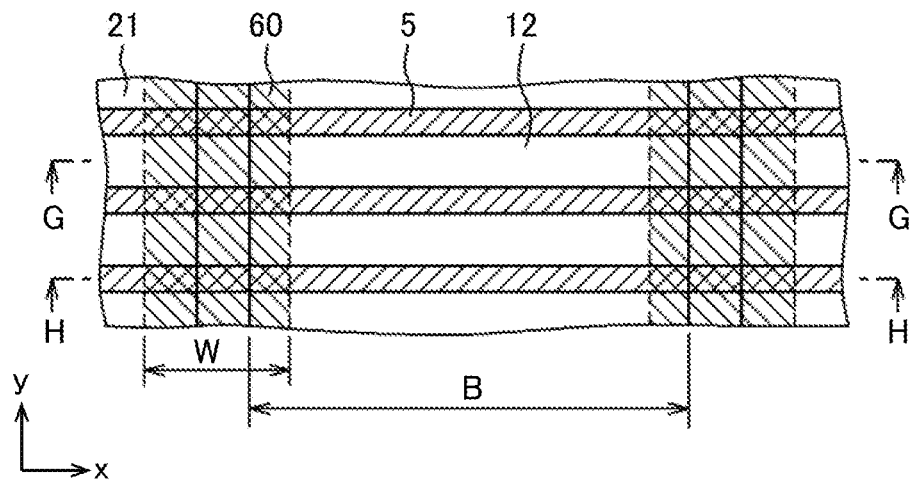
FIG. 18A is a plan view of another example of the embodiment 3.
Figure 18B:
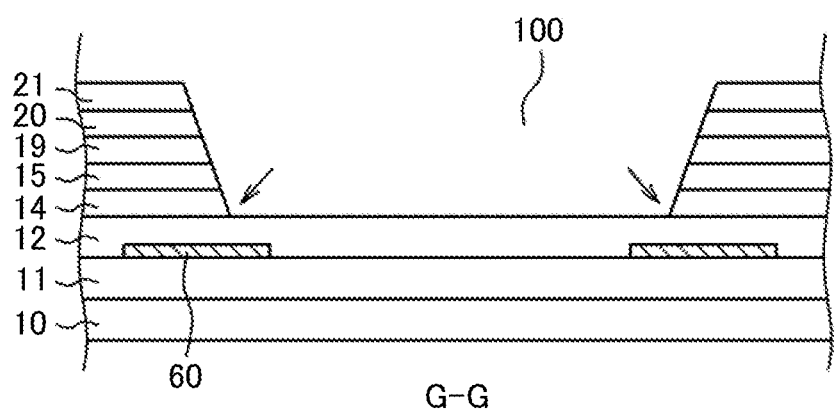
FIG. 18B is a cross sectional view along the G-G line of FIG. 18A.
Figure 18C:
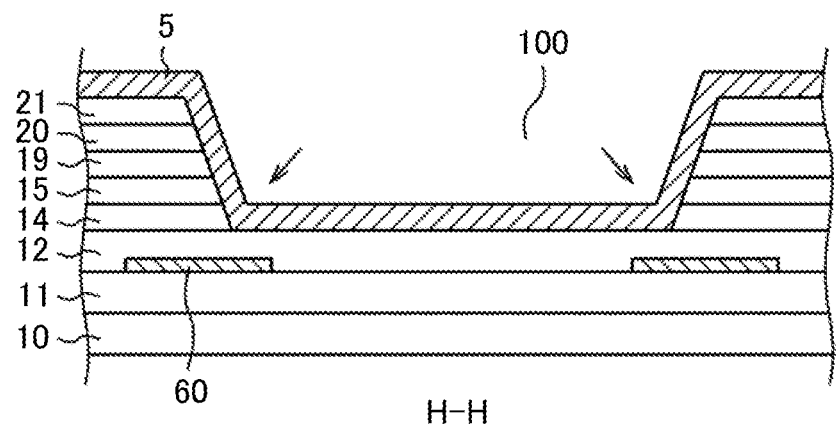
FIG. 18C is a cross sectional view along the H-H line of FIG. 18A.

FIGS. 18A through 18C are yet another example of the present embodiment. FIG. 18A is a plan view of the bending area B. In FIG. 18A, the terminal wirings 5 extend in the x direction across the recess 100 formed in the bending area B and are arranged in the y direction with a certain pitch. In FIG. 18A, at the corner of the recess 100, the reflection metal 60 extends in the y direction with a width of w under the terminal wiring 5 via the barrier film 12. The reflection metal 60 prevents the resist remaining at the corner of the recess 100.

FIG. 18B is a cross sectional view along the line G-G in FIG. 18A. In FIG. 18B, the reflection metal 60 exists at the corner of the recess 100 as indicated by the arrow. The reflected light form the reflection metal 60 compensates the exposing light, thus, the resist remaining 101 does not occur.

FIG. 18C is a cross sectional view along the line H-H in FIG. 18A. In FIG. 18C, the terminal wiring 5 made of metal exists at the corner of the recess 100 as indicated by the arrow. The reflected light form the terminal wiring 5 compensates the exposing light, thus, the resist remaining 101 does not occur.

As described above, the structure, explained by 18A through FIG. 18C, enables to utilize the reflection light at all the position of the corner of the recess 100 in the exposure, thus, the chance of the resist remaining can be substantially decreased. The structure, explained by 18A through FIG. 18C, however, needs to form the reflection metal 60 before the barrier film 12 is formed, thus, the process is increased. If an adhering strength between the reflection metal 60 and the polyimide substrate 11 is a problem, it is necessary to form the SiO film and the like between the reflection metal 60 and the polyimide substrate 11 to improve the adherence between the reflection metal 60 and the polyimide substrate 11. In the meantime, if it is desired to remove the SiO film from the bending area B, a patterning of the SiO film is necessary. The patterning of the SiC film can be executed by the same photo lithography for the patterning of the reflection metal 60.

Embodiment 4

Figure 19A:
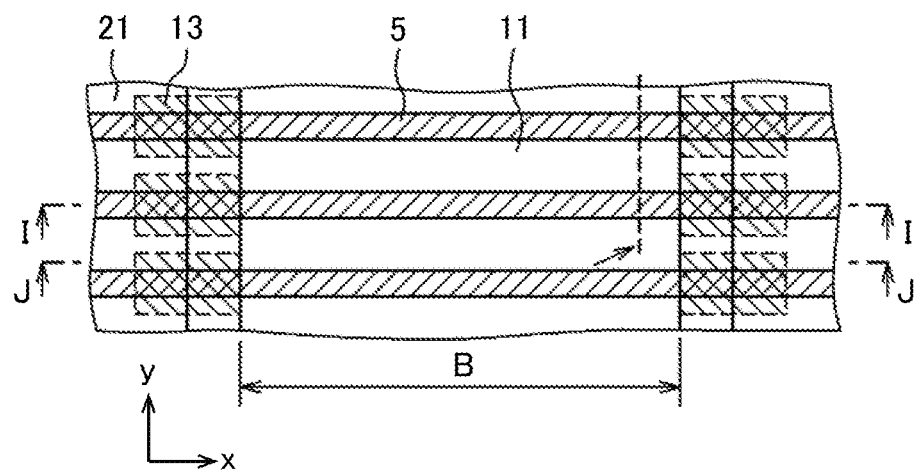
FIG. 19A is a plan view of the embodiment 4.

FIGS. 19A through 19D are figures to explain the embodiment 4. FIG. 19A is a plan view of the bending area B in embodiment 4. In FIG. 19A, the terminal wirings 5 extend in the x direction across the recess 100 formed in the bending area B and are arranged in the y direction with a certain pitch. In FIG. 19A, the polyimide substrate 11 is exposed to the surface in the recess 100 while the surface is the third interlayer insulating film 21 at places other than the recess 100.

Figure 19B:
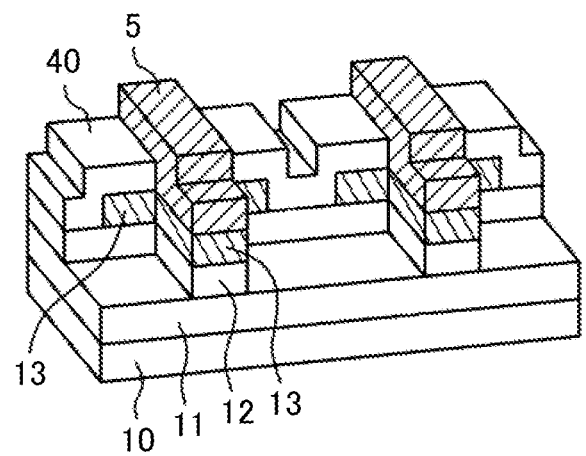
FIG. 19B is a perspective view of FIG. 19A.

FIG. 19B is a perspective view of FIG. 19A when it is viewed from the arrow in FIG. 19A. As shown in FIG. 19B, the light shield metal 13 and the barrier film 12 exist under the terminal wiring 5; however, in the area other than the portion of the terminal wiring 5, the light shield metal 13 and the barrier film 12 are removed, thus, the polyimide substrate 11 is exposed. Namely, only one layer of the polyimide substrate 11 exists in the bending area B at the area other than the terminal wirings 5 are formed. By the way, the glass substrate 10 that is the lower most layer in FIG. 19B is removed at the last process.

Figure 19C:
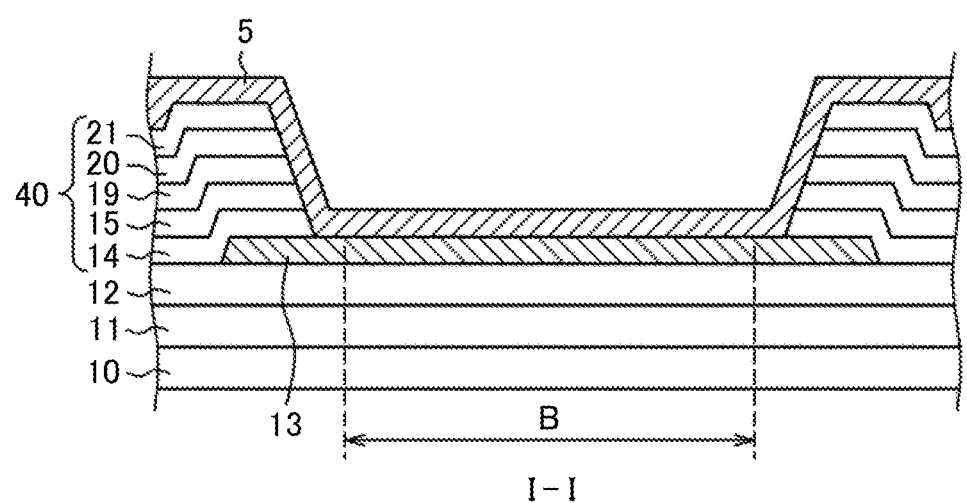
FIG. 19C is a cross sectional view along the I-I line of FIG. 19A.
Figure 19D:
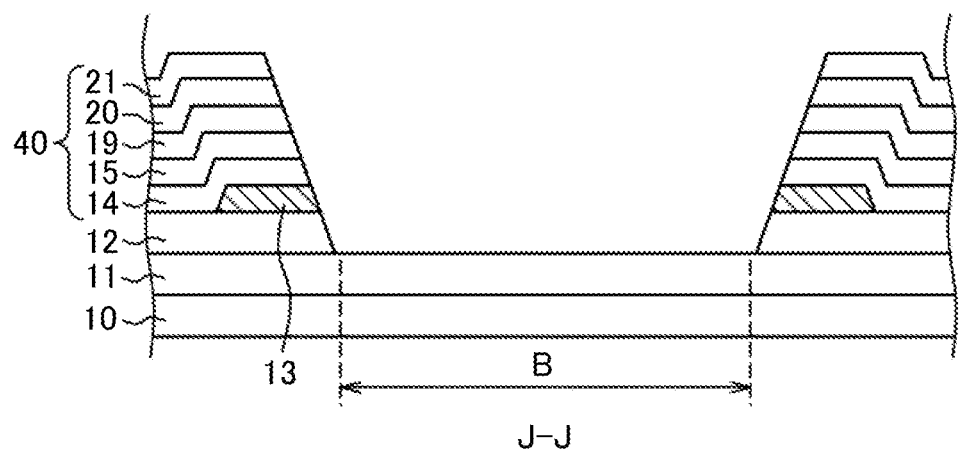
FIG. 19D is a cross sectional view along the J-J line of FIG. 19A.

FIG. 19C is a cross sectional view along the line I-I in FIG. 19A; FIG. 19D is a cross sectional view along the line J-J in FIG. 19A. Namely, as depicted in FIG. 19C and FIG. 19D, only one layer of the polyimide substrate 11 exists in the bending area B at the area other than the terminal wirings 5 are formed. Therefore, the stress to the barrier film 12 is further reduced in this embodiment than in the structures of the embodiment 1 to the embodiment 3; thus, a danger of breaking of the barrier film 12 can be avoided. Consequently, the danger of disconnection of the terminal wiring 5 is further reduced.

Embodiment 5

Figure 20A:
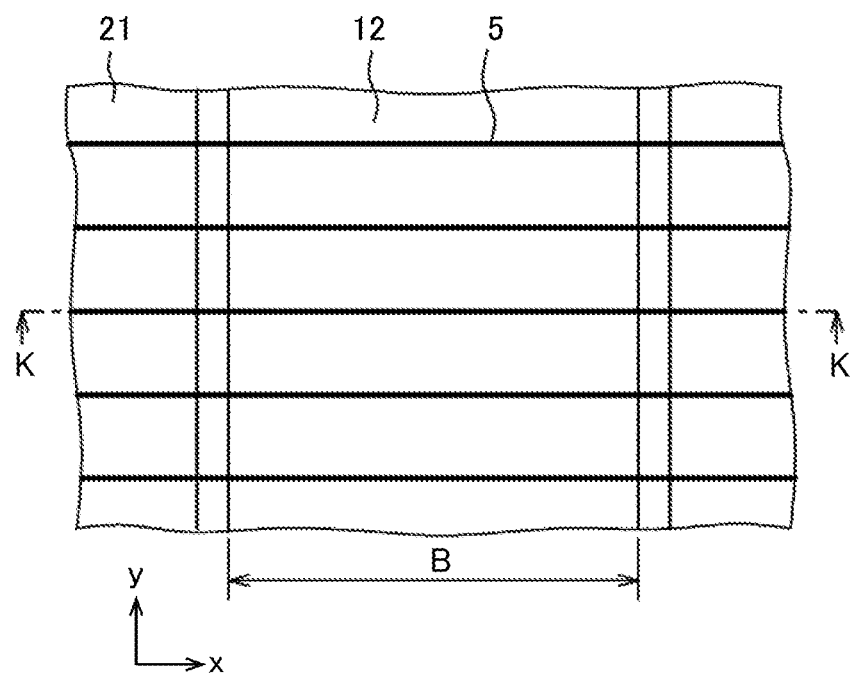
FIG. 20A is a plan view of the bending area as a comparative example to the embodiment 5.
Figure 20B:
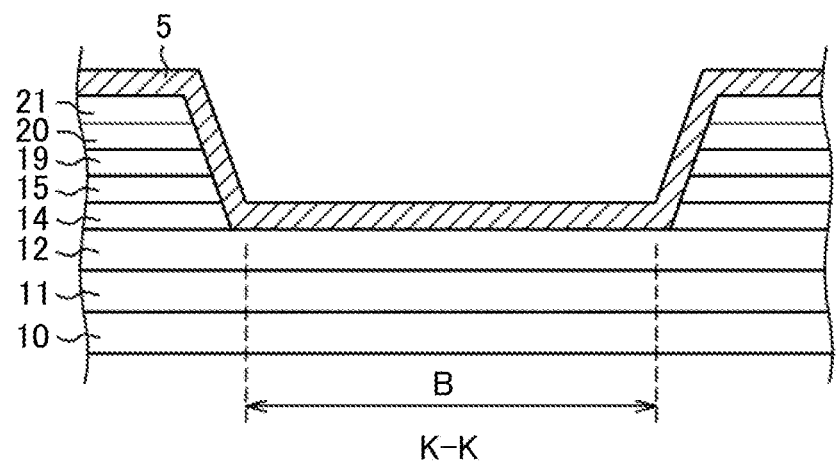
FIG. 20B is a cross sectional view along the K-K line of FIG. 20A.

FIG. 20A through FIG. 22 are figures to explain the embodiment 5. FIG. 20A is a plan view of the bending area B explained in the embodiments 1 through 3. In the bending area B in FIG. 20A, the terminal wirings 5 extend in the x direction in line, and arranged in the y direction in a predetermined pitch. FIG. 20B is a cross sectional view along the K-K line in FIG. 20A. In FIG. 20B, the terminal wiring 5 extends along the inner wall and the bottom of the recess 100 in the bending area B.

Figure 21:
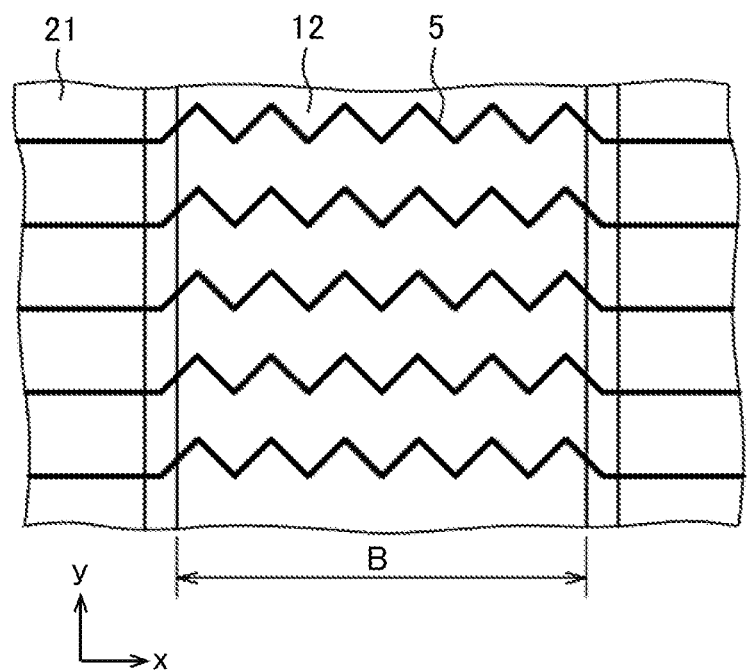
FIG. 21 is a plan view of the bending area according to the embodiment 5.

FIG. 21 is a plan view of the bending area B according to the present embodiment. In FIG. 21, the terminal wirings 5 extend in the x direction in zigzag shape and arranged in the y direction in a predetermined pitch. The cross sectional view of the bending area B in FIG. 21 is equivalent to FIG. 20B. When the bending area B is bent, the stress to the terminal wiring 5 can be less when it is in a zigzag shape than when it is in a straight line.

The stress in the wiring 5, itself, can be reduced by making the terminal wiring 5 as the structure of FIG. 21, the danger of disconnection of the terminal wiring 5 in the bending area can be further reduced.

Figure 22:
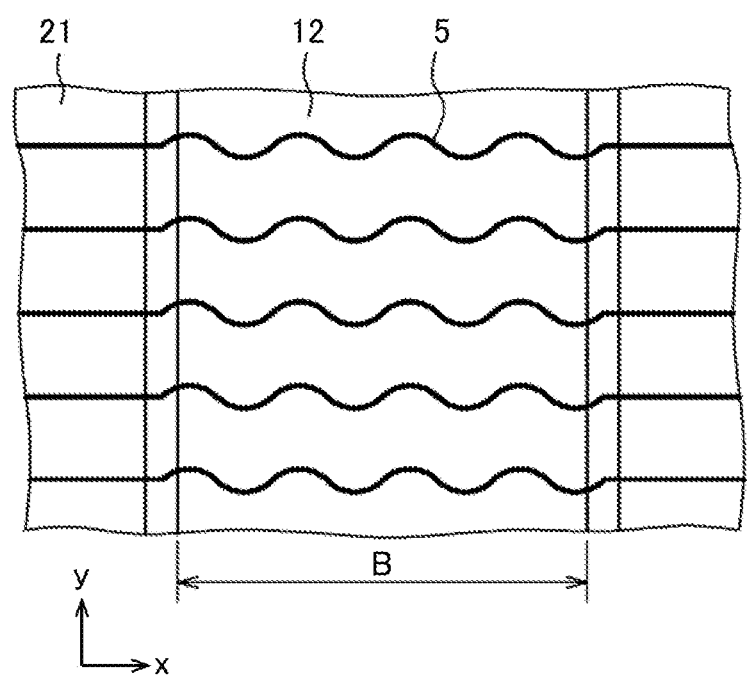
FIG. 22 is a plan view of the bending area according to another example of the embodiment 5.

FIG. 22 is a plan view of the bending area B according to another example of the present embodiment. In FIG. 22, the terminal wirings extend in the x direction in wave shape and arranged in the y direction in a predetermined pitch. The cross sectional view of the bending area B in FIG. 22 is equivalent to FIG. 20B. When the bending area B is bent, the stress to the terminal wiring 5 can be less when it is in a wave shape than when it is in a straight line.

The stress in the wiring 5, itself, can be reduced by making the terminal wiring 5 as the structure of FIG. 22, the danger of disconnection of the terminal wiring 5 in the bending area can be further reduced.

In FIG. 8 of the embodiment 1, the light shield metal 13 is formed under the oxide semiconductor layer 16; the TFT can be made a dual gate type when the light shield metal 13 is used as the second gate electrode. In this case, both of the first undercoat film 14 and the second undercoat film 15 work as the gate insulating film. In this case, too, the second gate electrode can work as the light shield metal to shield the semiconductor layer 16 that constitutes the TFT from the back light.

In the above explanations, the semiconductor layer that constitutes the TFT is made of the oxide semiconductor; however, the semiconductor layer can be made of the poly-Si (poly-silicon) or a-Si (amorphous silicon). Further, in the above explanations, the liquid crystal display device is IPS type; however, the present invention is applicable to other types of the liquid crystal display devices.

Further, the present invention is applicable to the organic EL display device. In the organic EL display device, too, the display area and the driving circuit are formed on the same substrate; and the bending area can be formed in the terminal area. The cross sectional structure of the organic EL display device is the same as the liquid crystal display device from the TFT substrate up to the organic passivation film, thus, the present invention explained above can be applicable to the organic EL display device.

What is claimed is:

1. A display device having a display area, a driving circuit area and a bending area comprising:
    a first thin film transistor and a first interlayer insulating film are formed in the display area,
    a second thin film transistor and a second interlayer insulating film are formed in the driving circuit area,
    the first thin film transistor, the second thin film transistor, the first interlayer insulating film and the second interlayer insulating film are removed to form a recess in the bending area,
    terminal wirings extend in a first direction and are arranged in a second direction in the recess,
    the recess includes a corner in a cross sectional view,
    a first metal is formed in an island shape under the terminal wiring at the corner of the recess,
    a width of the first metal in the second direction is greater than a width of the terminal wiring in the second direction.

2. The display device according to claim 1, wherein the first metal is made of a same material and formed on a same layer as a light shield metal for the first thin film transistor and a light shield metal for the second thin film transistor.

3. The display device according to claim 1, wherein the first metal is made of a same material and formed on a same layer as a gate electrode for the first thin film transistor and a gate electrode for the second thin film transistor.

4. The display device according to claim 1, wherein the first interlayer insulating film is formed by a plurality of inorganic insulating films,
    the second interlayer insulating film is formed by a plurality of inorganic insulating films.

5. The display device according to claim 1, wherein the first interlayer insulating film is formed by a plurality of inorganic insulating films including a silicon oxide film and a silicon nitride film,
    the second interlayer insulating film is formed by a plurality of inorganic insulating films including a silicon oxide film and the silicon nitride film.

6. The display device according to claim 1, wherein the terminal wirings, which connect with the display area or the driving circuit area, extend in the bending area from the display area to the driving circuit area,
    the terminal wirings are arranged in a direction orthogonal to the direction from the display area to the driving circuit area.

7. The display device according to claim 1, wherein the terminal wirings, which connect the display area and the driving circuit area, extend in the bending area from the display area to the driving circuit area,
    the terminal wirings are arranged in a direction orthogonal to the direction from the display area to the driving circuit area.

8. The display device according to claim 1, wherein the first thin film transistor includes a first semiconductor layer, the second thin film transistor includes a second semiconductor layer,
    both of the first semiconductor layer and the second semiconductor layer are made of an oxide semiconductor.

9. The display device according to claim 1, wherein the display device including a substrate made of a polyimide substrate.

10. The display device according to claim 1, wherein the terminal wirings formed in the bending area extend in the first direction in a zigzag shape and are arranged in a direction orthogonal to the first direction in a plan view.

11. The display device according to claim 1, wherein the terminal wirings formed in the bending area extend in the first direction in a wave shape and are arranged in a direction orthogonal to the first direction in a plan view.

12. A display device having a display area, a driving circuit area and a bending area comprising:
    a first thin film transistor and a first interlayer insulating film are formed in the display area,
    a second thin film transistor and a second interlayer insulating film are formed in the driving circuit area,
    the first thin film transistor, the second thin film transistor, the first interlayer insulating film and the second interlayer insulating film are removed to form a recess in the bending area,
    terminal wirings extend in a first direction and are arranged in a second direction in the recess,
    the recess includes a corner in a cross sectional view,
    a first metal, which has a first width, extends in the second direction under the terminal wirings via a first insulating film at the corner of the recess.

13. The display device according to claim 12, wherein the terminal wirings connect the display area and the driving circuit area.

14. The display device according to claim 12, wherein the first metal is made of a same material and formed on a same layer as a light shield metal for the first thin film transistor and a light shield metal for the second thin film transistor.

15. The display device according to claim 12, wherein the first metal is made of a same material and formed on a same layer as a gate electrode for the first thin film transistor and a gate electrode for the second thin film transistor.

16. The display device according to claim 12, wherein the first interlayer insulating film is formed by a plurality of inorganic insulating films,
    the second interlayer insulating film is formed by a plurality of inorganic insulating films.

17. The display device according to claim 12, wherein the first thin film transistor includes a first semiconductor layer, the second thin film transistor includes a second semiconductor layer,
    both of the first semiconductor layer and the second semiconductor layer are made of an oxide semiconductor.

18. The display device according to claim 12, wherein the display device including a substrate made of a polyimide substrate.

19. The display device according to claim 12,
wherein the terminal wirings formed in the bending area extend in the first direction in a zigzag shape and are arranged in a direction orthogonal to the first direction in a plan view.

20. The display device according to claim 12,
wherein the terminal wirings formed in the bending area extend in the first direction in a wave shape and are arranged in a direction orthogonal to the first direction in a plan view.

\* \* \* \* \*